(12) United States Patent
Kim et al.

(10) Patent No.: US 7,949,322 B2
(45) Date of Patent: May 24, 2011

(54) FREQUENCY SELECTIVE AMPLIFIER WITH WIDE-BAND IMPEDANCE AND NOISE MATCHING

(75) Inventors: Tae Wook Kim, Austin, TX (US); Kenneth Charles Barnett, Austin, TX (US)

(73) Assignee: QUALCOMM, Incorporated, San Diego, CA (US)

( * ) Notice: Subject to any disclaimer, the term of this patent is extended or adjusted under 35 U.S.C. 154(b) by 842 days.

(21) Appl. No.: 11/684,120

(22) Filed: Mar. 9, 2007

(65) Prior Publication Data

US 2008/0220735 A1    Sep. 11, 2008

(51) Int. Cl.
*H04B 1/06* (2006.01)
*H04B 1/16* (2006.01)
*H03F 3/52* (2006.01)

(52) U.S. Cl. ............... 455/248.1; 455/194.2; 330/105; 330/282

(58) Field of Classification Search ............. 455/150.1, 455/194.2, 309, 311, 341, 339, 340, 550.1, 455/556.1, 107, 248.1; 330/252, 302, 305, 330/254, 75, 86, 95, 105, 282
See application file for complete search history.

(56) References Cited

U.S. PATENT DOCUMENTS

| | | | | |
|---|---|---|---|---|
| 5,374,966 A | * | 12/1994 | Weigand | 348/707 |
| 5,546,050 A | * | 8/1996 | Florian et al. | 330/282 |
| 5,805,023 A | * | 9/1998 | Fukuden | 330/302 |
| 6,005,441 A | * | 12/1999 | Kawahara | 330/294 |
| 6,621,376 B2 | * | 9/2003 | Liu et al. | 333/126 |
| 6,724,251 B1 | * | 4/2004 | Ziazadeh et al. | 330/86 |
| 6,946,909 B2 | * | 9/2005 | Barnett | 330/252 |
| 7,064,575 B2 | * | 6/2006 | Lou | 326/30 |
| 7,088,179 B2 | * | 8/2006 | Gilbert et al. | 330/254 |
| 7,151,411 B2 | * | 12/2006 | Martin et al. | 330/305 |
| 7,259,643 B2 | * | 8/2007 | Son et al. | 333/174 |
| 7,342,458 B2 | * | 3/2008 | Bas et al. | 330/302 |
| 7,423,487 B2 | * | 9/2008 | Fornasari et al. | 330/282 |

(Continued)

FOREIGN PATENT DOCUMENTS

GB    2356307    5/2001

OTHER PUBLICATIONS

Chunbing Guo et al: "A fully-integrated 900-MHz CMOS wireless receiver with on-chip RF and IF filters and 79-dB image rejection" 2001 Symposium on VLSI Circuits. Digest of Technical Papers. Kyoto, Japan, Jun. 14-16, 2001; [Symposium on VLSI Circuits], Tokyo : JSAP, JP, Jun. 14, 2001, pp. 241-244, XP010551553.

(Continued)

*Primary Examiner* — Sonny Trinh
(74) *Attorney, Agent, or Firm* — Kenyon S. Jenckes; William M. Hooks

(57) ABSTRACT

This disclosure is directed to a frequency-selective low noise amplifier (LNA) with wide-band impedance and noise matching. The LNAS may include a closed loop circuit that supports wideband input matching. For example, the closed loop circuit may be configure to impedance match an input signal and provide a low noise figure. In addition, the LNA may include an open loop circuit that amplifies the input signal and provides a high output impedance. The open loop circuit may further include a selectivity filter that filters out frequencies outside a desired frequency band. The LNA may drive a tunable band-pass filter via the open loop circuit.

30 Claims, 11 Drawing Sheets

U.S. PATENT DOCUMENTS 7,639,079 B2 * 12/2009 Chang et al. .................. 330/260

OTHER PUBLICATIONS

International Search Report and Written Opinion—PCT/US2008/056366, International Search Authority—European Patent Office—Aug. 7, 2008 (061712).

Jacques C Rudell et al: "A 1.9-GHz Wide-Band IF Double Conversion CMOS Receiver for Cordless Telephone Application" IEEE Journal of Solid-State Circuits, IEEE Service Center, Piscataway, NJ, US, vol. 32, No. 12, Dec. 1, 1997, XP011060631.

Sung Min Park et al: "1-GB/S 80-Dbomega Fully Differential CMOS Transimpedance Amplifier in Multichip on Oxide Technology for Optical Interconnects" IEEE Journal of Solid-State Circuits, IEEE—Service Center, Piscataway, NJ, US, vol . 39, No. 6, Jun. 1, 2004, pp. 971-974, XP001223109.

* cited by examiner

FREQUENCY SELECTIVE AMPLIFIER WITH WIDE-BAND IMPEDANCE AND NOISE MATCHING

TECHNICAL FIELD

This disclosure generally relates to amplifiers and, more particularly, to frequency selective amplifiers for wide-band telecommunication.

BACKGROUND

A wireless receiver typically includes a low noise amplifier (LNA) to amplify radio frequency signals received by an antenna. The wireless receiver may include tunable elements that permit frequency-selective processing of incoming signals across a range of frequencies. A wireless receiver may be provided within a variety of devices, including digital televisions, digital direct broadcast systems, personal digital assistants (PDAs), laptop computers, desktop computers, digital music and video players, handheld gaming devices, video game consoles, digital cameras, digital recording devices, cellular or satellite radio telephones, and the like.

Some devices may be equipped to process digital video, e.g., according to video broadcasting standards such as DVB-H (digital video broadcast-handheld), ISDB-T (integrated services digital broadcast-terrestrial), DMB (digital media broadcast), or FLO (forward link only). For DVB-H and FLO broadcasting, for example, video may be broadcast over a wide frequency band of approximately 470 megahertz (MHz) to 862 MHz. A wireless receiver in a device equipped to handle a wide frequency band should support precise frequency selection with appropriate impedance and noise matching.

SUMMARY

This disclosure is directed to a frequency-selective low noise amplifier (LNA) with wide-band impedance and noise matching. The LNA may include a closed loop circuit that supports wideband input matching. For example, the closed loop circuit may be configured to impedance match an input signal and provide a low noise figure. In addition, the LNA may include an open loop circuit that amplifies the input signal and provides a high output impedance. The open loop circuit may further include a selectivity filter that filters out frequencies outside a desired frequency band. The LNA may drive a tunable band-pass filter via the open loop circuit.

In one example, the disclosure provides an amplifier comprising a closed loop circuit that provides impedance matching for an input signal, and an open loop circuit, coupled to the closed loop circuit, that amplifies the impedance-matched input signal.

In another example, the disclosure provides a wireless receiver comprising a radio frequency (RF) antenna, and an amplifier comprising a closed loop circuit that provides impedance matching for an input signal received via the antenna, and an open loop circuit, coupled to the closed loop circuit, that amplifies the impedance-matched input signal.

In an additional example, the disclosure provides a method comprising providing impedance matching for an input signal via a closed loop circuit, and amplifying the impedance-matched input signal via an open loop circuit, wherein the open loop circuit and the closed loop circuit share a common input transistor to receive the input signal.

The details of one or more aspects of the disclosure are set forth in the accompanying drawings and the description below. Other features may be apparent from the description and drawings, and from the claims.

DETAILED DESCRIPTION

This disclosure is directed to a frequency-selective low noise amplifier (LNA) with wide-band impedance and noise matching. The LNA may include a closed loop circuit that supports wideband input matching. For example, the closed loop circuit may be configured to impedance match an input signal and provide a low noise figure. In addition, the LNA may include an open loop circuit that amplifies the input signal and provides a high output impedance. The open loop circuit may further include a selectivity filter that filters out frequencies outside a desired frequency band. The LNA may drive a tunable band-pass filter via the open loop circuit.

The LNA may be referred to as a "partial feedback" amplifier in the sense that it includes a combination of a closed loop feedback circuit for wideband impedance and noise matching, and an open loop gain circuit for high output impedance and stable frequency selectivity. For example, the selectivity filter may be placed within the open loop circuit, rather than in an overall closed loop circuit, to avoid instability. The LNA may be configured to support precise frequency selection, input impedance matching, and noise matching over a wide frequency band. The selectivity filter may reject frequencies outside of the band of interest. The tunable band-pass filter may pass particular narrow-band frequencies within the wide band, on a selective, adjustable basis.

The LNA may be useful in a variety of devices, including devices equipped to process digital video. For example, the LNA may be configured to process video signals across a wide band, such as the frequency band used for DVB-H and FLO video broadcasting, i.e., approximately 470 megahertz (MHz) to 862 MHz. This band generally resides in the ultra high frequency (UHF) band. This disclosure may refer to the frequency band associated with DVB-H and FLO video for purposes of illustration. However, an LNA as described in this disclosure may be applicable to a wide variety of frequency bands and devices, including devices equipped to process signals carrying audio, video, and/or data.

Figure 1:
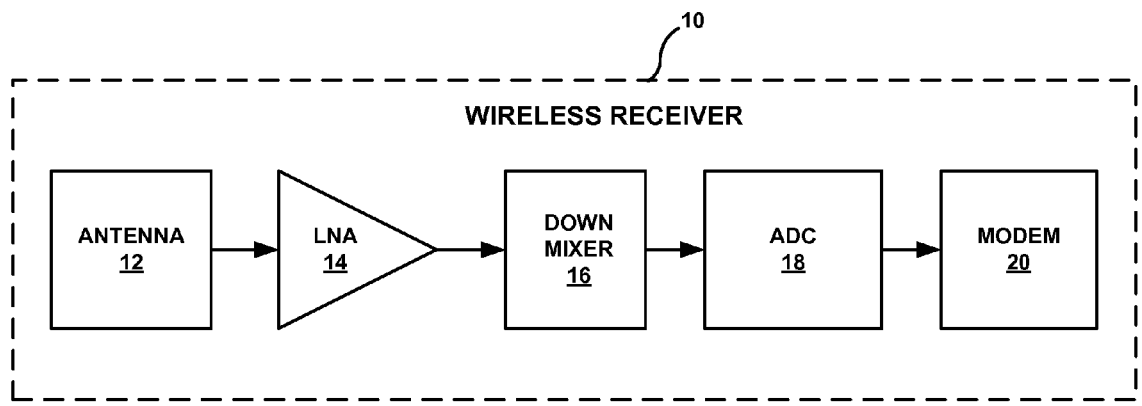
FIG. 1 is a block diagram of an exemplary wireless receiver including a low noise amplifier (LNA).

FIG. 1 is block diagram illustrating an exemplary wireless receiver 10 including an LNA in accordance with this disclosure. As shown in FIG. 1, receiver 10 may include an antenna 12, LNA 14, down mixer 16, analog-to-digital converter (ADC) 18, and modem 20. Receiver 10 may be part of a wireless communication device that is equipped to receive wireless audio, video and/or signals. In one example, receiver 10 may be provided in a wireless communication device configured to receive DVB-H and/or FLO broadcast signals. In addition, the wireless communication device may include a wireless transmitter to transmit wireless signals to other devices, e.g., for audio telephony, video telephony and/or data transmission. Accordingly, wireless receiver 10 may include other components that are not shown in FIG. 1 for ease of illustration.

In receiver 10, antenna 12 receives radio frequency (RF) signals and provides the received signals to LNA 14. LNA 14 receives, as an input signal, the signal received by antenna 12. LNA 14 may be configured to handle the input signal as a single-ended or differential signal, as will be described. LNA 14 amplifies the received input signal for further processing by down mixer 16, ADC 18 and modem 20. Antenna 12 may receive signals over a broad range of frequencies. For optimum power transfer, the input impedance of LNA 14 should be matched to the input signal over the broad range of input frequencies, e.g., approximately 470 MHz to 862 MHz in the example case of DVB-H or FLO digital video broadcast signals.

Also, because the signal received by LNA 14 may be weak, the LNA should have a low noise figure (NF). The NF generally refers to the ratio of the actual output noise of the LNA 14 to noise that would remain if the device itself did not introduce noise. It is important for LNA 14 to have a low noise figure so that the effect of any noise generated by LNA 14 on the input signal is reduced. If LNA 14 has a low noise figure, it can amplify a weak signal received by antenna 12 without significant degradation of the output signal. As will be described, LNA 14 may be constructed with a partial feedback circuit to present desirable impedance and noise matching to the input signal received from antenna 12, while providing necessary gain and frequency selectivity.

LNA 14 provides the amplified signal to down-mixer 16. Down mixer 16 may be any type of mixer that converts the frequency of the broadband input signal to a baseband frequency, such as a zero intermediate frequency (ZIF) or low intermediate frequency (LIF) down mixer. Down-mixer 16 provides the baseband signal to ADC 18, which converts the analog baseband signal to digital data. Modem 20 demodulates the digital data provided by ADC 18. An audio or video decoder may be provided within receiver 10 to decode the demodulated digital data to drive an audio speaker, visual display, and/or other user interface media. The audio or video decoder may form part of a combined encoder-decoder (CO-DEC), and support both decoding of digital data received from another device and encoding of digital data for transmission to another device.

For example, receiver 10 may form part of a device configured to support video compression and decompression, e.g., according to MPEG-2, MPEG-4, ITU-T H.263, ITU-T H.264, or its counterpart, ISO/IEC MPEG-4, Part 10, i.e., Advanced Video Coding (AVC). In addition, for video broadcasting reception, wireless receiver 10 can be used to receive RF signals in frequency bands associated with delivery of FLO, DVB-H, ISDB-T, or DMB digital video broadcasts. DVB-H and FLO broadcasting, for example, may utilize a wide frequency band of approximately 470 MHz to 862 MHz. As will be described, LNA 4 may be configured to support precise frequency selectivity with impedance and noise matching over a wide frequency band, such as bands associated with DVB-H and FLO. In some cases, receiver 10 may include multiple LNAs to handle sub-bands within a wider overall frequency band.

Figure 2:
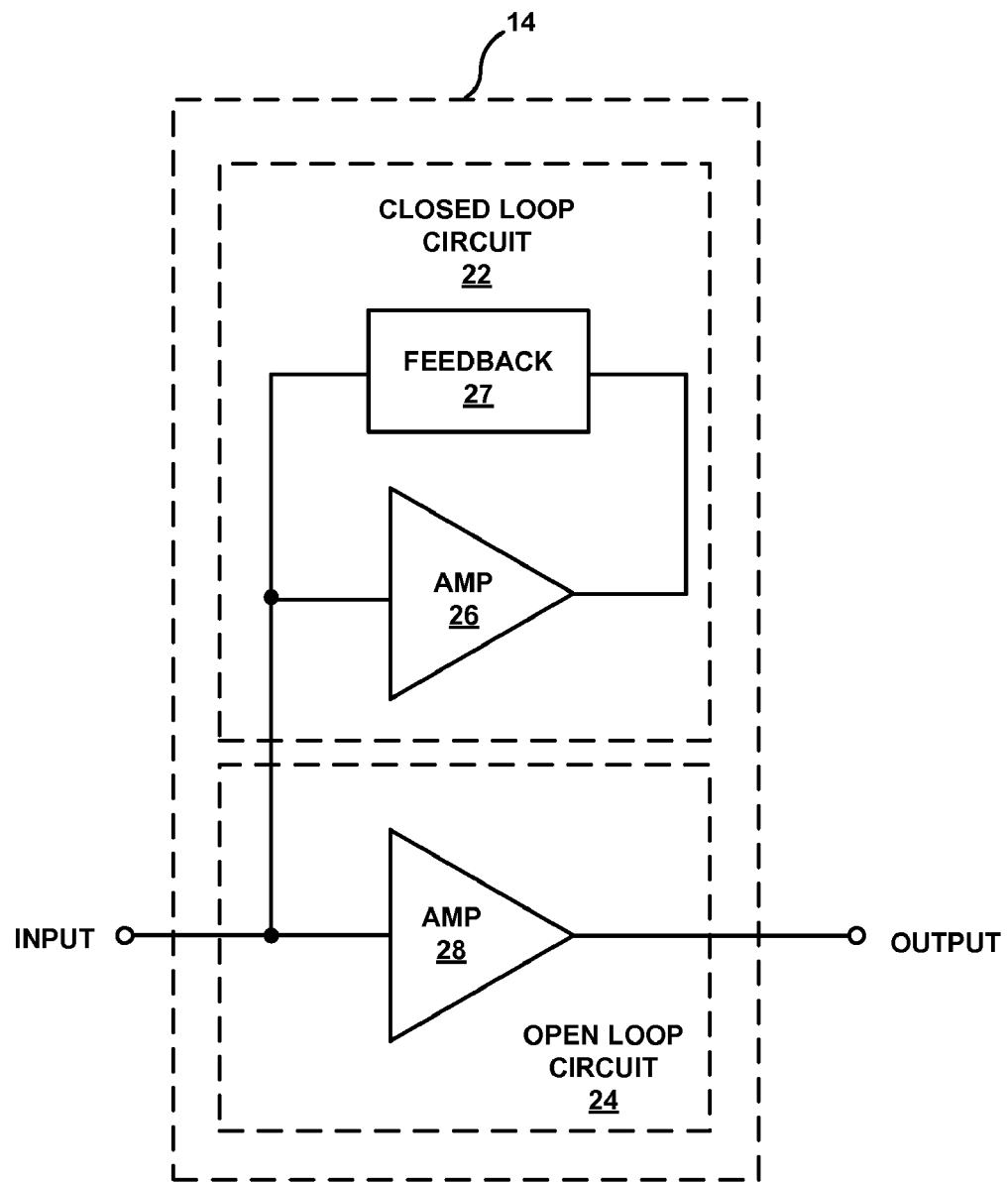
FIG. 2 is a block diagram of an LNA including closed loop and open loop circuits.

FIG. 2 is a block diagram of an exemplary LNA 14 in accordance with an aspect of this disclosure. In the example of FIG. 2, LNA 14 includes a closed loop circuit 22 and an open loop circuit 24 that work together to provide a partial feedback LNA. Both closed loop circuit 22 and open loop circuit 24 receive an input signal via a common input. The signal provided to the input may be received as an RF signal from antenna 12 (FIG. 1), or may be received as an RF signal via other types of wired or wireless media such as copper conductors, optical fibers, or the like. LNA 14 may be configured as a single-ended or differential amplifier, in which cases closed loop circuit 22 and open loop circuit 24 may be configured to form a single-ended or differential LNA 14.

Closed loop circuit 22 may include a closed loop gain amplifier 26 and a feedback loop 27 that sets the closed loop gain. Closed loop circuit 22 supports wideband input matching. For example, closed loop circuit 22 may be configured to provide impedance matching for the input signal and provide a low noise figure. Open loop circuit 24 may include an open loop gain amplifier 28. Open loop circuit 24 amplifies the input signal and presents a high output impedance to its load. A selectivity filter may be provided within open loop circuit 22 to filter out frequencies outside a desired frequency band. In addition, open loop circuit 24 may drive a tunable bandpass filter. By placing the selectivity filter within open loop circuit 24, instability can be reduced. In addition, by providing input impedance matching via closed loop circuit 22, a low NF can be preserved.

The partial feedback topology of LNA 14 provides an alternative to common gate or full feedback topologies. LNAs having a common gate topology tend to produce a high NF, and therefore are not generally suitable for wideband impedance matching. In general, LNAs having a feedback topology can provide low NF and acceptable wideband input matching. However, an LNA having a feedback topology tends to present a low output impedance due to the required feedback loop between the output and input of the LNA. If output impedance is reduced, filter selectivity at the load of the LNA will be degraded. In addition, an LNA having a feedback topology typically cannot support a selectivity filter in the feedback loop due to instability.

By providing a partial feedback topology, rather than a common gate or full feedback topology, LNA 14 can provide wideband input matching, low NF, and sufficient output impedance. In addition, LNA 14 may support the incorporation of a selectivity filter within the LNA, e.g., within open loop circuit 24. In particular, closed loop circuit 22 may support wideband input matching with low NF, while open loop circuit 24 may support signal amplification with high output impedance and permit incorporation of a selectivity filter without presenting instability. In addition, with high output impedance, a tunable band-pass filter can be placed at the load of open loop circuit 24 without significantly degrading selectivity of the selectivity filter.

Figure 3:
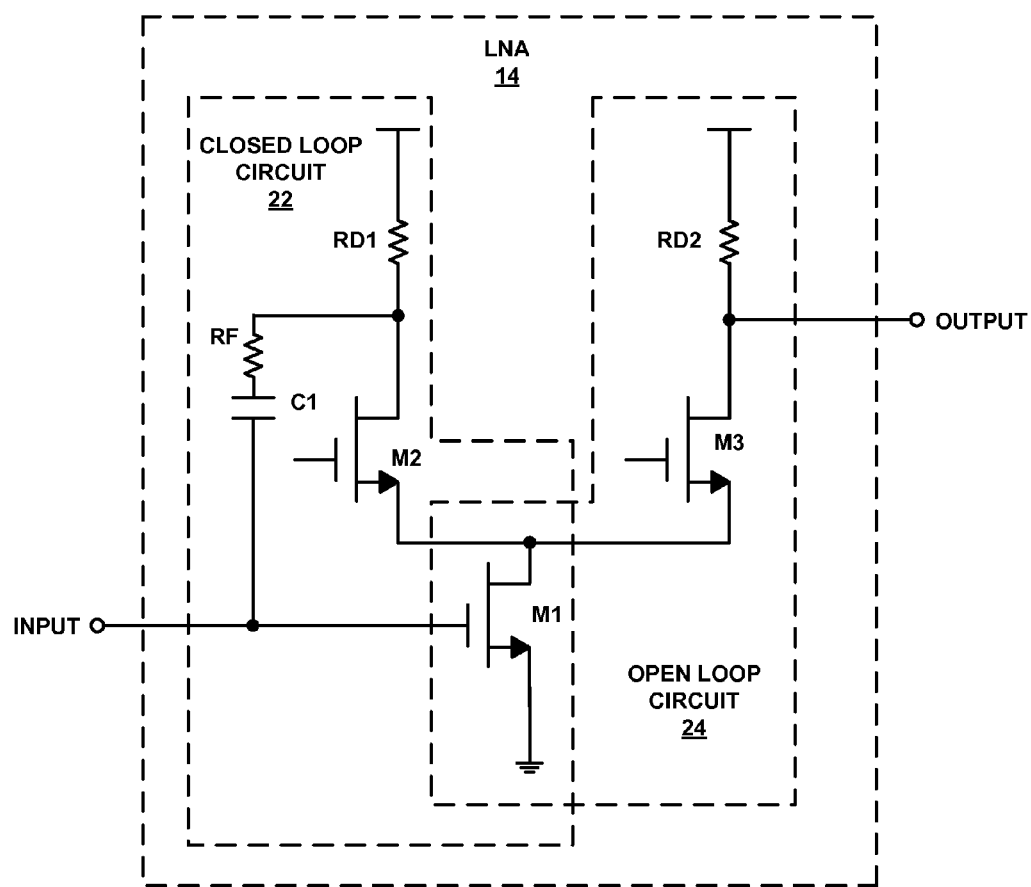
FIG. 3 is a circuit diagram illustrating a single-ended LNA including closed loop and open loop circuits.

FIG. 3 is a circuit diagram illustrating a single-ended LNA 14 including closed loop circuit 22 and open loop circuit 24. In the example of FIG. 3, closed loop circuit 22 includes transistors M1 and M2, resistors RD1 and RF, and a capacitor C. Transistors M1 and M2 may be, for example, field effect transistors (FETs). The gate of transistor M1 receives the input signal. One side of capacitor C may be coupled to receive the input signal, while the other side of capacitor C may be coupled to a first side of resistor RF in series. One side of resistor RD1 may be connected to a voltage source. The second side of resistor RD1 may be connected to a second side of resistor RF. In addition, the second side of resistor RD1 also may be coupled to the source of transistor M2. The drain of transistor M2 may be coupled to the source of transistor M1. The drain of transistor M1 may be coupled to ground. Hence, feedback loop 27 may comprise capacitor C, resistors RD1 and RF, and transistor M2. Closed loop gain amplifier 26 may comprise resistor RD1 and transistors M2 and M1.

In the example of FIG. 3, open loop circuit 24 includes transistors M1 and M3 and resistor RD2. Accordingly, closed loop circuit 22 and open loop circuit 24 may share transistor M1 in some implementations. Input transistor M1 shared between closed loop circuit 22 and open loop circuit 24 may be a single transistor or a plurality of transistors in parallel to achieve desired transistor characteristics. The gate of transistor M1 receives the input signal. The source of transistor M1 may be coupled to ground. The drain of transistor M1 may be coupled to the source of transistor M3, as well as the source of transistor M2. The source of transistor M3 may be coupled a first side of resistor RD2. A second side of resistor RD2 may be coupled to the voltage source. The output of LNA 14 may be the source voltage of transistor M3. The gates of transistors M2 and M3 may be coupled to a bias circuit (not shown) that applies a bias current so that transistors M2 and M3 remain in the active region of operation. By adjusting the relative sizes of transistors M2 and M3, it is possible to adjust the signal ratio between closed loop circuit 22 and open loop circuit 24 to optimize noise figure, input matching and gain performance of the overall circuit. In addition, different bias voltages can be applied to transistors M2 and M3 to adjust the signal ratio between closed loop circuit 22 and open loop circuit 24.

The output impedance of LNA 14 may be approximated by the value of resistor RD2 of open loop circuit 24. The input impedance of LNA 14 is dominated by the input impedance Rin of closed loop circuit 22, which may be approximated as:

$Rin = RF/(1+T)$, where $T = gm*(W1/(W1+W2))*(RD1)$, and where $g_m$ is the transconductance of transistor M1, W1 is the gate width of transistor M1, and W2 is the gate width of transistor M2. As can be seen from the input impedance equation above, the input impedance of LNA 14 is independent of the input frequency. Therefore, the input impedance of LNA 14 may be matched to the impedance of the input signal over a broad range of input frequencies. Further, as described above, the noise of LNA 14 may be reduced with the partial feedback topology provided in closed loop circuit 22. With a reduction in noise, the noise figure may also decrease. However, the feedback topology is not present in open loop circuit 24, increasing the output impedance of LNA 14, and permitting the incorporation of a selectivity filter in the open loop circuit without introducing instability.

Again, the input impedance presented by closed loop circuit 22 may be independent of the frequency of the input signal. As indicated above, the input impedance of closed loop circuit 22 may be modeled as the input impedance of closed loop gain amplifier 26 divided by the combination of signal gain of closed loop amplifier 26 multiplied by the signal gain of feedback loop 27 plus one. The gain of closed loop amplifier 26 and feedback loop 27 may be varied in different implementations of LNA 14. The input impedance of LNA 14 may be modeled as the input impedance of closed loop circuit 22 in parallel with the input impedance of open loop 22. However, the input impedance of open loop circuit 24 typically will be configured to be much larger than the input impedance of closed loop circuit 22. Therefore, the input impedance of LNA 14 may not be affected by the input impedance of open loop circuit 24, and the input impedance of LNA 14 may be approximately the same as the input impedance of closed loop circuit 22.

Closed loop circuit 22 may also provide low noise figure for LNA 4. As discussed above, low noise figure allows amplification of weak signals without degradation on the output. Components within an amplifier inherently generate noise due to random fluctuations in electric current. The output signal of an amplifier is degraded because the amplifier amplifies both the input signal and the inherent noise. If the noise level is high, it may be difficult to differentiate between the amplified signal and the amplified inherent noise on the output signal of the amplifier.

To minimize the effect of noise, an amplifier may require a high signal-to-noise ratio. In receiver 10, an amplifier may receive a weak signal. In the case where an amplifier receives a weak signal, the noise has to be decreased to obtain a high signal-to-noise ratio. Closed loop circuit 22 may decrease the inherent noise at the input of LNA 14 using the partial feedback topology comprising closed loop gain amplifier 26 and feedback loop 27. The noise at the input of LNA 14 may be calculated as the noise at the input of closed loop gain amplifier 26 divided by the combination of the signal gain of closed loop gain 26 multiplied by the signal gain of feedback loop 27 plus one. In general, closed loop circuit 22 provides input resistance impedance without degrading NF performance, according to the equation $Rin = RF/(1+T)$. As the inherent noise of the LNA 14 is reduced, the noise figure may be reduced correspondingly.

While closed loop circuit 22 may provide impedance matching and low noise figure, closed loop circuit 22 may not provide high output impedance. High output impedance may be needed to drive various components within receiver 10. Therefore, high output impedance and signal amplification may be provided by open loop circuit 24 within LNA 14. Open loop 24 amplifies the impedance matched input signal with a desired gain. In addition, open loop circuit 24 may be designed to provide high output impedance. In this example, the output of open loop circuit 24 may be the output of LNA 14. Open loop circuit 24 may provide high output impedance because the output of open loop 22 may be electrically independent from closed loop circuit 22. Hence, the impedance of closed loop circuit 22 does not significantly affect the output impedance of open loop circuit 24 and the output impedance of open loop circuit 24 may be designed to the desired value.

Figure 4:
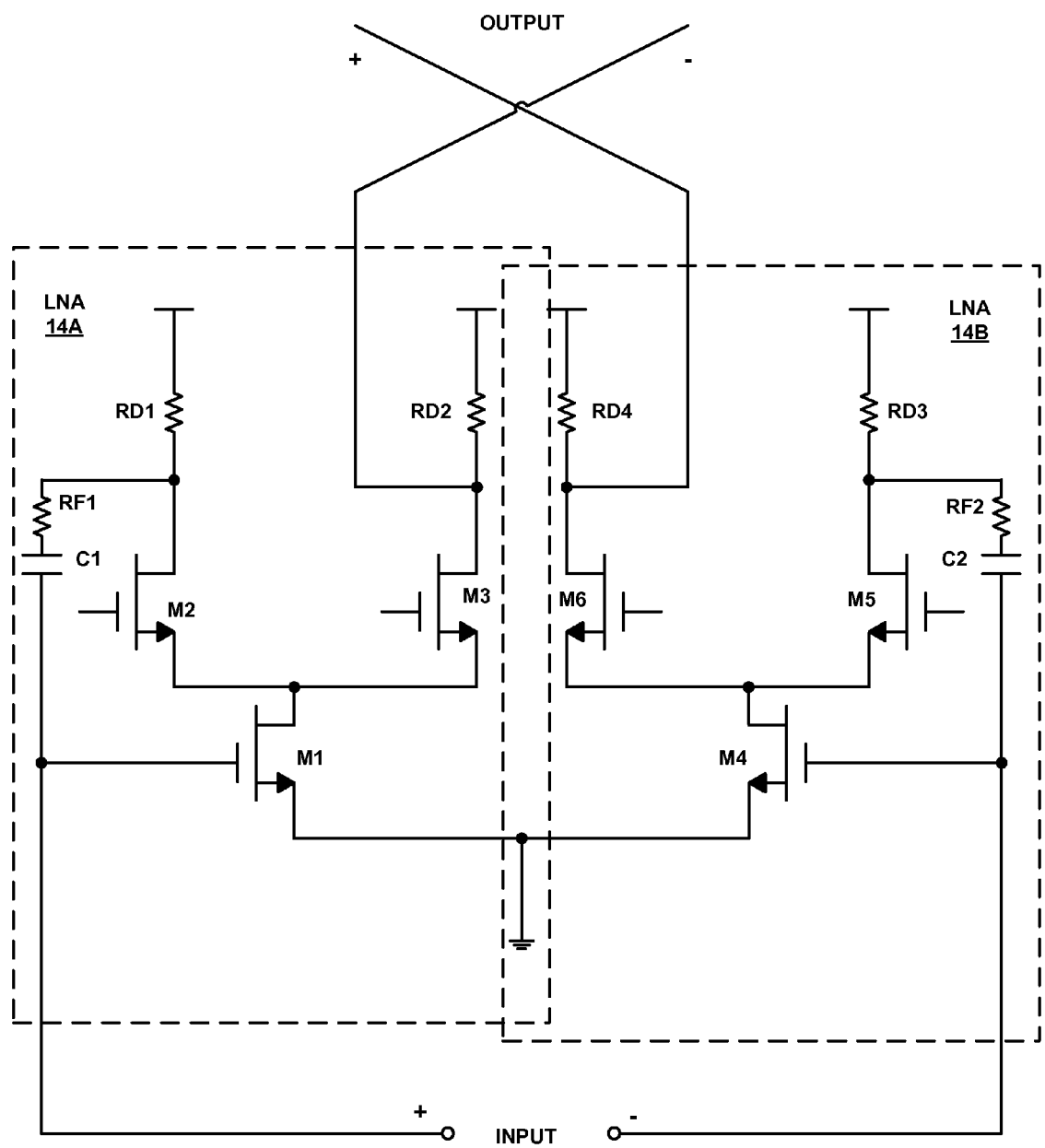
FIG. 4 is a circuit diagram illustrating a differential LNA including closed loop and open loop circuits.

FIG. 4 is a circuit diagram illustrating a differential LNA 14S including closed loop and open loop circuits. In the example of FIG. 4, differential LNA 14S includes a first LNA 14A that receives a positive differential input signal and a second LNA 14B that receives a negative differential input signal. LNA 14A includes transistors M1, M2, M3, resistors RF1, RD1, and capacitor C1, arranged in the manner described above with respect to FIG. 3. LNA 14B is configured identically to LNA 14A, and includes corresponding transistors M4, M5, M6, resistors RD3 and RF1, and capacitor C2. The gate of transistor M1 may receive the positive input signal from input 12. The positive input may also be connected to a capacitor C1. Similarly, the negative input is coupled to the gate of transistor M4, as well as to capacitor C2. LNA 14A and 14B are combined to accept a differential input signal across positive and negative input terminals, and produce a combined differential output signal across positive and negative output terminals. The gates of transistors M2, M3, M5 and M6 may be coupled to respective bias circuits (not shown) that apply bias currents so that the transistors remain in the active region of operation.

Figure 5:
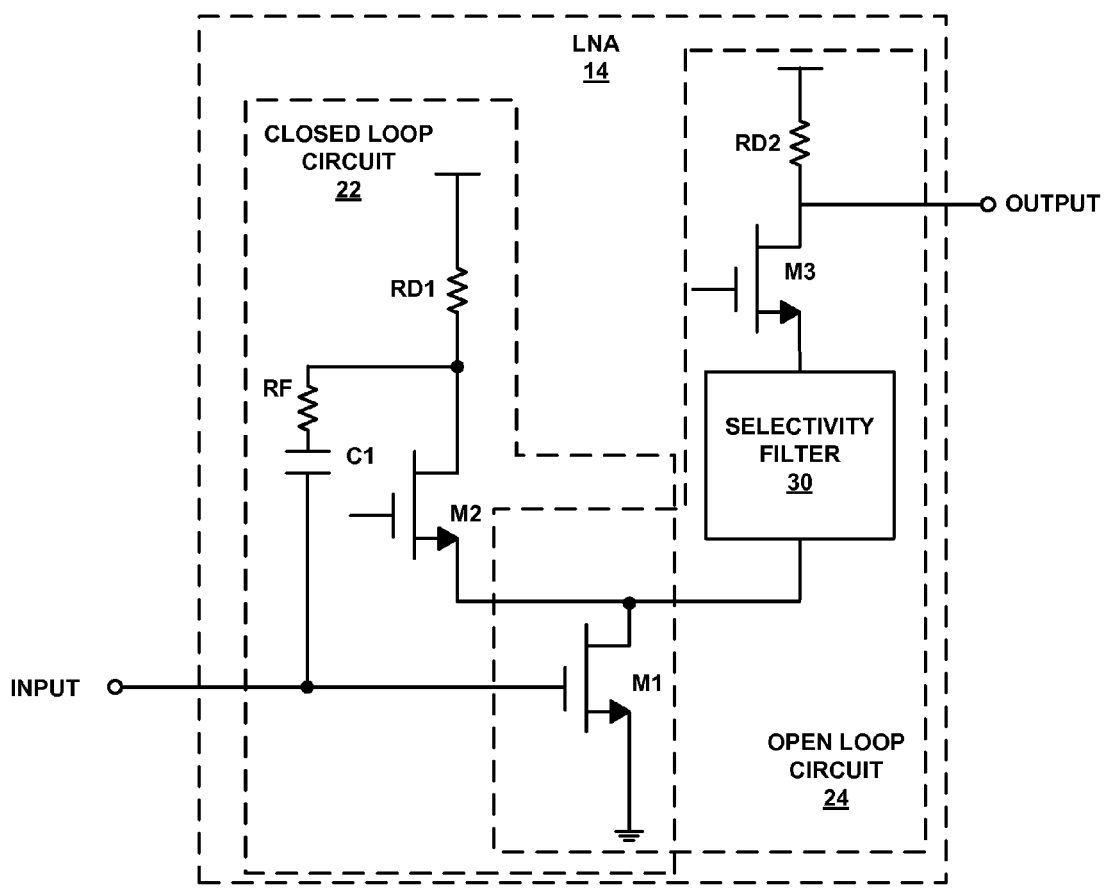
FIG. 5 is a circuit diagram illustrating a single-ended LNA including a closed loop circuit and open loop circuit with a selectivity filter.

FIG. 5 is a circuit diagram illustrating a single-ended LNA 14T including a closed loop circuit 22 and open loop circuit 24 with a selectivity filter 30. LNA 14T of FIG. 5 corresponds substantially to LNA 14 of FIG. 2, but further includes selectivity filter 30. As shown in FIG. 5, selectivity filter 30 may reside between the drain of transistor M1 and the source of transistor M3 in open loop circuit 24. In some implementations, the output of open loop circuit 24 may drive a tunable band-pass filter, as will be described, or other loads. The gates of transistors M2 and M3 may be coupled to a bias circuit (not shown) that applies a bias current so that transistors M2 and M3 remain in the active region of operation.

A DVB-H or FLO device, as an example, may operate within a wide frequency band of approximately 470 megahertz and 862 megahertz. However, the device may perform other functions that operate in frequency ranges outside the DVB-H or FLO bands, or be exposed to frequency ranges outside those bands. For example, in a GSM 1800 system, input 12 may receive frequencies ranging from 1.710 gigahertz to 1.785 gigahertz. In a UMTS system, input 12 may receive frequencies ranging from 1.92 gigahertz to 1.98 gigahertz. In a wireless local area network (WLAN), input 12 may receive frequencies ranging from 2.4 gigahertz to 2.48 gigahertz.

Propagation of signals with frequencies that are outside the band of interest may adversely affect performance of LNA 14T and other components in the receive chain, such as downmixer 16, ADC 18 and modem 20. For example, if frequencies outside the band of interest are not filtered out, downmixer 16 in receiver 10 may mix the frequencies into the baseband, possibly producing errors. In particular, in the baseband, frequencies within the band of interest may then overlap with frequencies outside the band of interest. For this reason, it may be desirable to provide selectivity filter 30 to reject signals with frequencies outside of the band of interest. Selectivity filter 30 may act as a rejection filter that presents a low impedance to signals with the desired frequency band and a high impedance to signals outside of the band of interest, e.g., jammer signals. Selectivity filter 30 can be incorporated within open loop circuit 24 without creating instability.

Selectivity filter 30 rejects out-of-band signals, and may be configured as a single-ended or differential filter, consistent with the configuration of LNA 14. In some cases, selectivity filter 30 may comprise a notch filter. A notch filter may attenuate the power of a signal at certain frequencies. As one example, the notch filter could be designed to significantly attenuate signals at 1.8 gigahertz and 2.4 gigahertz, while passing signals within a band of interest, e.g., 470 megahertz and 862 megahertz. Of course, the amount of attenuation, and the frequencies that are attenuated, may vary depending on design considerations. Also, selectivity filter 24 may include other filters in addition to a notch filter, such as a low pass filter.

Figure 6:
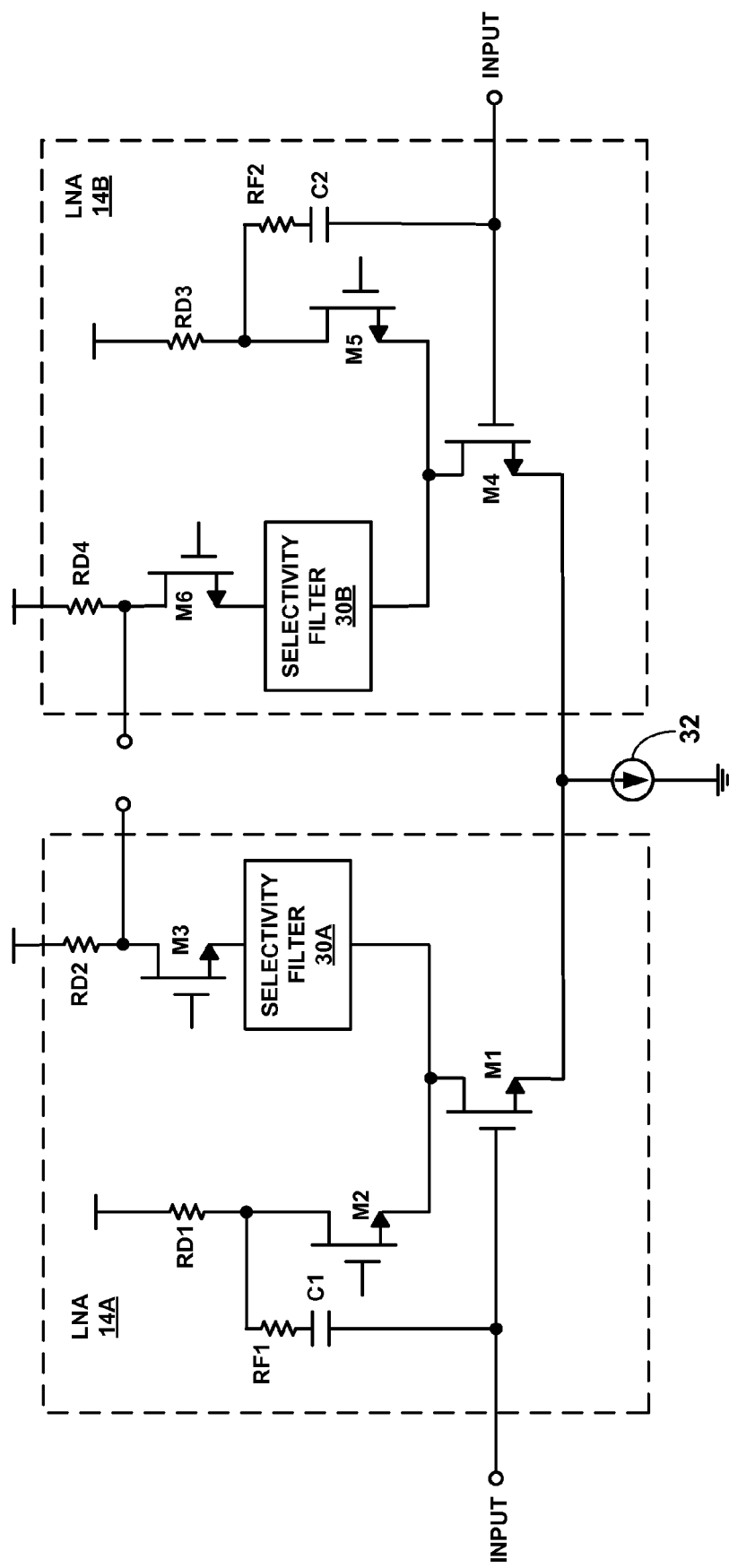
FIG. 6 is a circuit diagram illustrating a differential LNA including a closed loop circuits and open loop circuits with selectivity filters.

FIG. 6 is a circuit diagram illustrating a differential LNA 14U including a closed loop circuits and open loop circuits with selectivity filters. In the example of FIG. 6, LNA 14U includes a first LNA 14A that receives a positive differential input signal and a second LNA 14B that receives a negative differential input signal. LNA 14A includes transistors M1, M2, M3, resistors RF1, RD1, and capacitor C1, arranged in the manner described above with respect to FIG. 3. LNA 14B is configured identically to LNA 14A, and includes corresponding transistors M4, M5, M6, resistors RD3 and RF1, and capacitor C2. The gates of transistors M2, M3 and M5, M6 may be coupled to respective bias circuits (not shown) that apply bias currents so that the transistors remain in the active region of operation.

Each LNA 14A, 14B includes a selectivity filter 30A, 30B, respectively, or a portion of a shared selectivity filter. Each selectivity filter 30A, 30B may be arranged in the open-loop circuit 24 of a respective LNA 14A, 14B. LNA 14A and 14B are combined to accept a differential input signal across positive and negative input terminals, apply selective frequency filtering in open loop circuit 24, e.g., via a notch filter, and produce a combined differential output signal across positive and negative output terminals. A current source 32 may be provided in some implementations, and shared between LNA 14A and LNA 14B. Current source 32 allows the circuit to operate fully differentially. However, current source 32 is optional. As shown in FIG. 6, current source 32 may extend between the drains of transistors M1 and M4 and ground.

Figure 7:
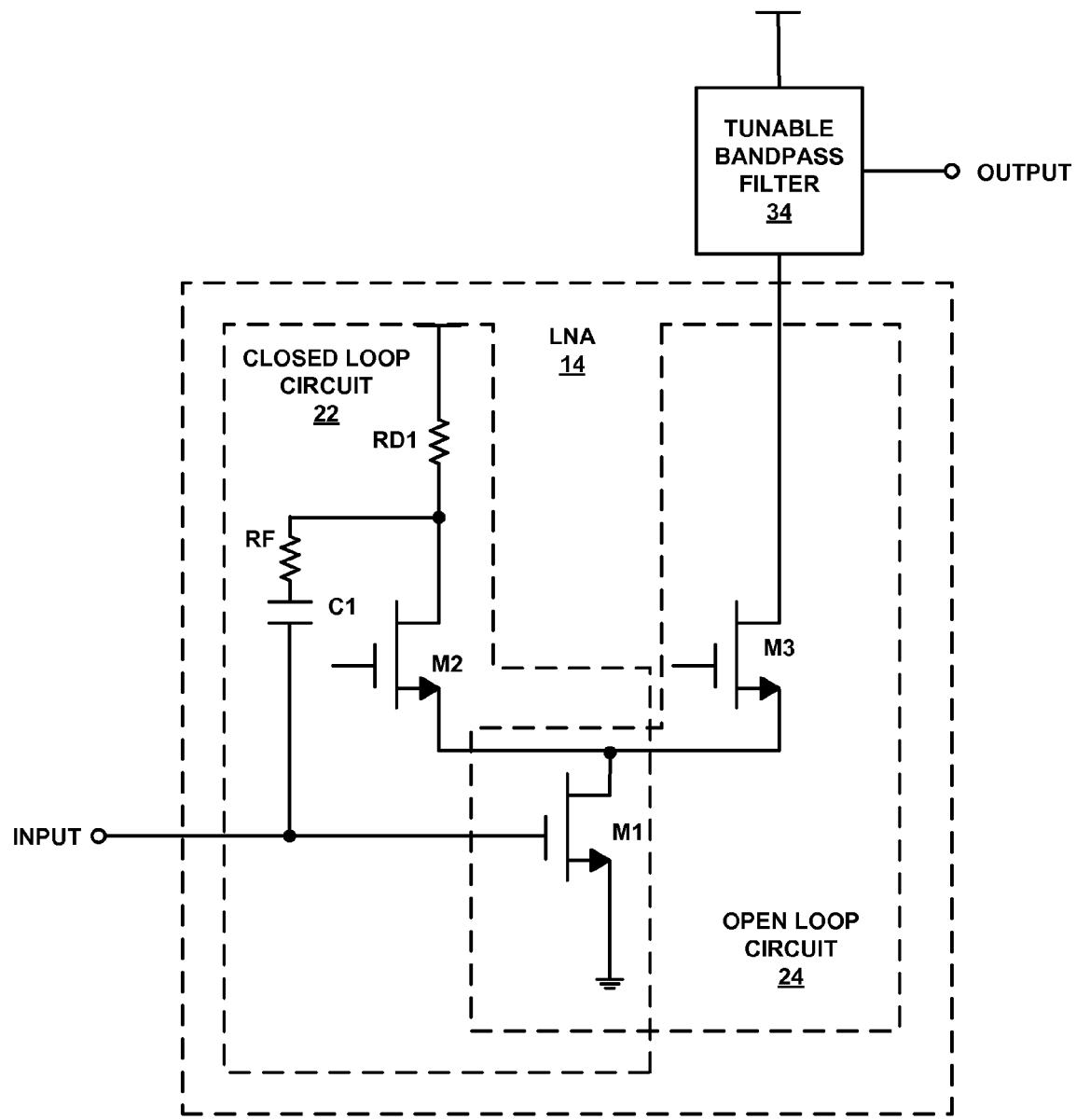
FIG. 7 is a circuit diagram illustrating a single-ended LNA including a closed loop circuit and open loop circuit driving a tunable bandpass filter.

FIG. 7 is a circuit diagram illustrating a single-ended LNA 14V including a closed loop circuit 22 and open loop circuit 24 driving a tunable bandpass filter 34. In the example of FIG. 7, LNA 14V generally corresponds to LNA 14 of FIG. 3, but includes tunable bandpass filter 34 as an output load. In addition, LNA 14 may omit resistor RD2, as shown in FIG. 7. Tunable bandpass filter 34 is coupled between the drain of transistor M3 in open loop circuit 24 and the power source, and may be single-ended or differential, consistent with the particular implementation of LNA 14. Again, the gates of transistors M2 and M3 may be coupled to a bias circuit (not shown) that applies a bias current so that transistors M2 and M3 remain in the active region of operation.

As an example, tunable bandpass filter 34 may be configured to support band selection and jammer rejection. In this manner, tunable bandpass filter 34 may permit tuning to a desired band, and supplement the jammer rejection provided by selectivity filter 30. In addition, in a differential implementation, tunable bandpass filter 34 may provided single to differential conversion, which may be required for some LNAs.

Tunable band-pass filter 34 may present a high impedance load and therefore requires a high impedance output. Open loop circuit 24 can provide the desired output impedance to drive tunable bandpass filter 34. In addition, open loop circuit 24 can accommodate selectivity filter 30, as described previously. At the same time, however, closed loop circuit 22 provides desired input impedance and noise matching.

Figure 8:
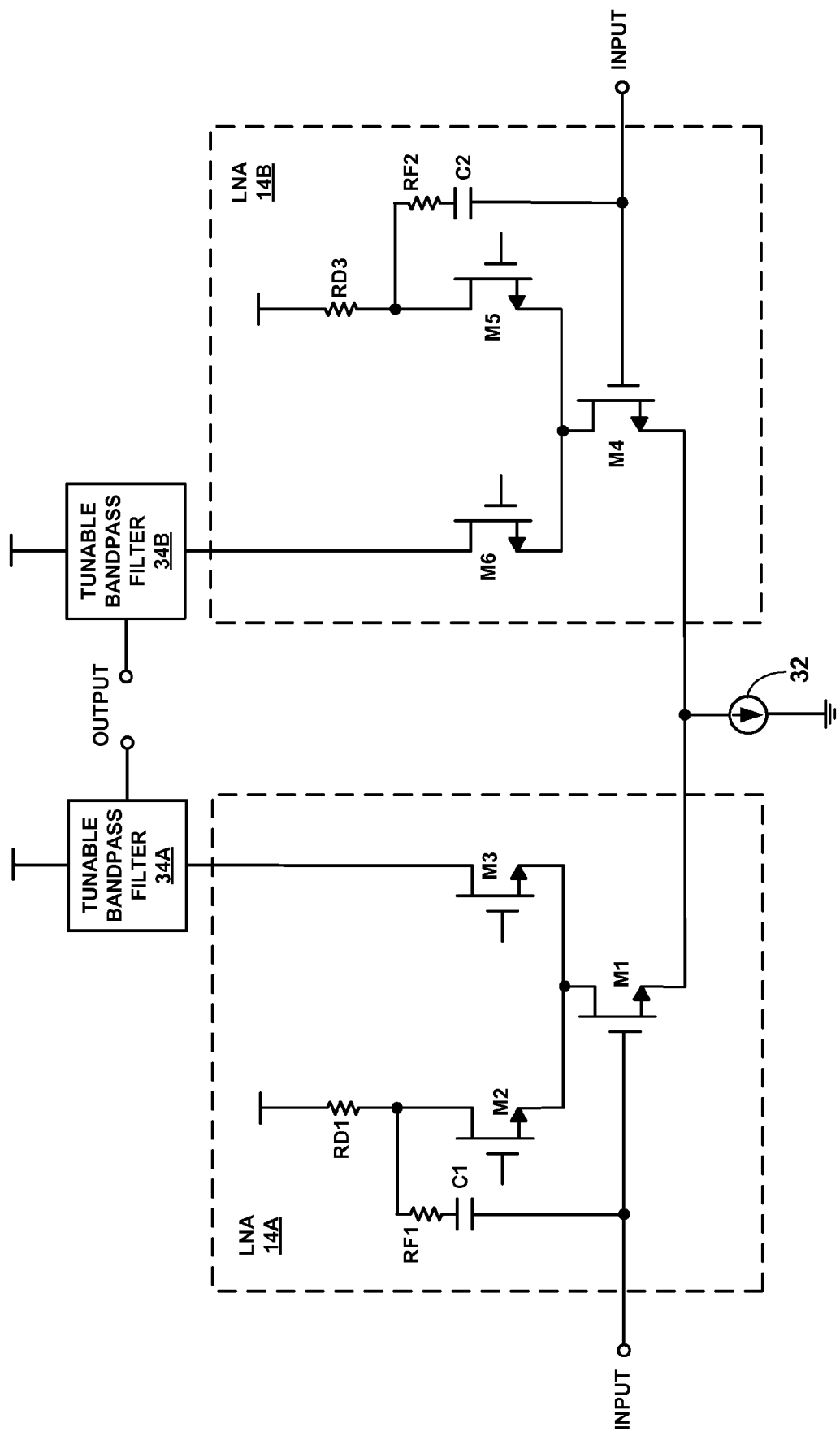
FIG. 8 is a circuit diagram illustrating a differential LNA including a closed loop circuit and open loop circuit driving a tunable bandpass filter.

FIG. 8 is a circuit diagram illustrating a differential LNA 14W including a closed loop circuit 22 and open loop circuit 24 driving a tunable bandpass filter 34. In the example of FIG. 8, a first LNA 14A receives a positive differential input signal and a second LNA 14B receives a negative differential input signal. LNA 14A includes transistors M1, M2, M3, resistors RF1, RD1, and capacitor C1, arranged in the manner described above with respect to FIG. 3. LNA 14B is configured identically to LNA 14A, and includes corresponding transistors M4, M5, M6, resistors RD3 and RF2, and capacitor C2. As in the previous examples, the gates of transistors M2, M3 and M5, M6 may be coupled to respective bias circuits (not shown) that apply bias currents so that the transistors remain in the active region of operation.

Each LNA 14A, 14B drives a tunable bandpass filter 34A, 34B, respectively, or a portion of a shared tunable bandpass filter. Each bandpass filter 34A, 34B may be arranged as the load for open-loop circuit 24 of a respective LNA 14A, 14B. LNA 14A and 14B are combined to accept a differential input signal across positive and negative input terminals, drive tunable bandpass filters 34A, 34B and produce a combined differential output signal across positive and negative output terminals presented by the tunable bandpass filters. Also shown in FIG. 8 is optional current source 32 extending from the common node coupling the sources of transistors M1 and M4 to ground.

Figure 9:
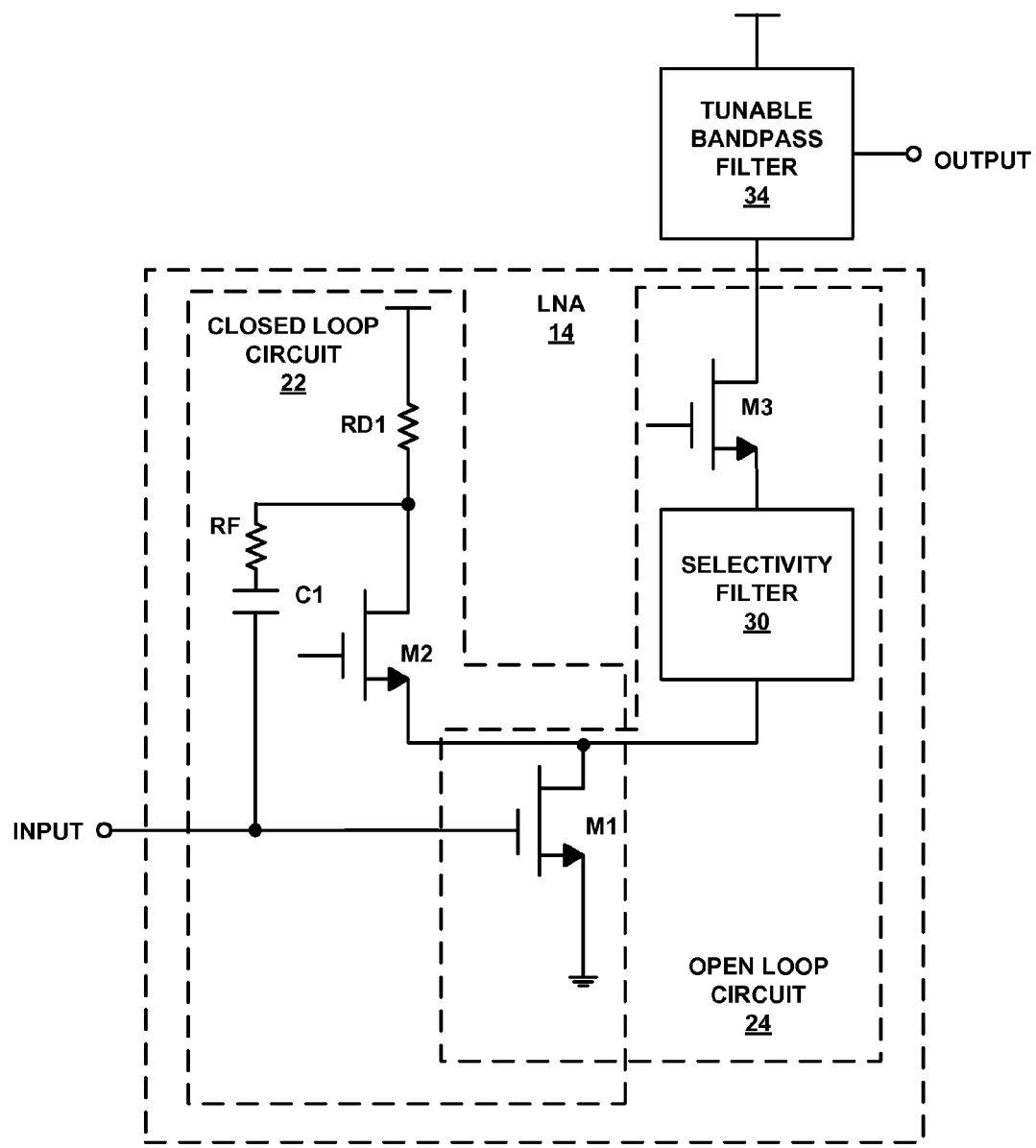
FIG. 9 is a circuit diagram illustrating a single-ended LNA including a closed loop circuit and open loop circuit including a selectivity filter and driving a tunable bandpass filter.

FIG. 9 is a circuit diagram illustrating a single-ended LNA 14X including a closed loop circuit 22 and open loop circuit 24 including a selectivity filter 30 and driving a tunable bandpass filter 34. In the example of FIG. 9, LNA 14X conforms generally to LNA 14 of FIG. 3, but includes selectivity filter 30 in open loop circuit 24 and drives tunable bandpass filter 34. In this case, selectivity filter 30 provides rejection of jammer signals at frequencies outside of the band of interest, and tunable bandpass filter 34 provides added jammer rejection plus the ability to selectively tune to particular frequency sub-bands within the wideband passed by LNA 14X. Again, closed loop circuit 22 provides desirable input impedance and noise matching, while open loop circuit 24 amplifies the input signal, produces a desired output impedance to drive tunable bandpass filter 34, and support incorporation of selectivity filter 30 within LNA 14X. The gates of transistors M2 and M3 may be coupled to a bias circuit (not shown) that applies a bias current so that transistors M2 and M3 remain in the active region of operation.

Figure 10:
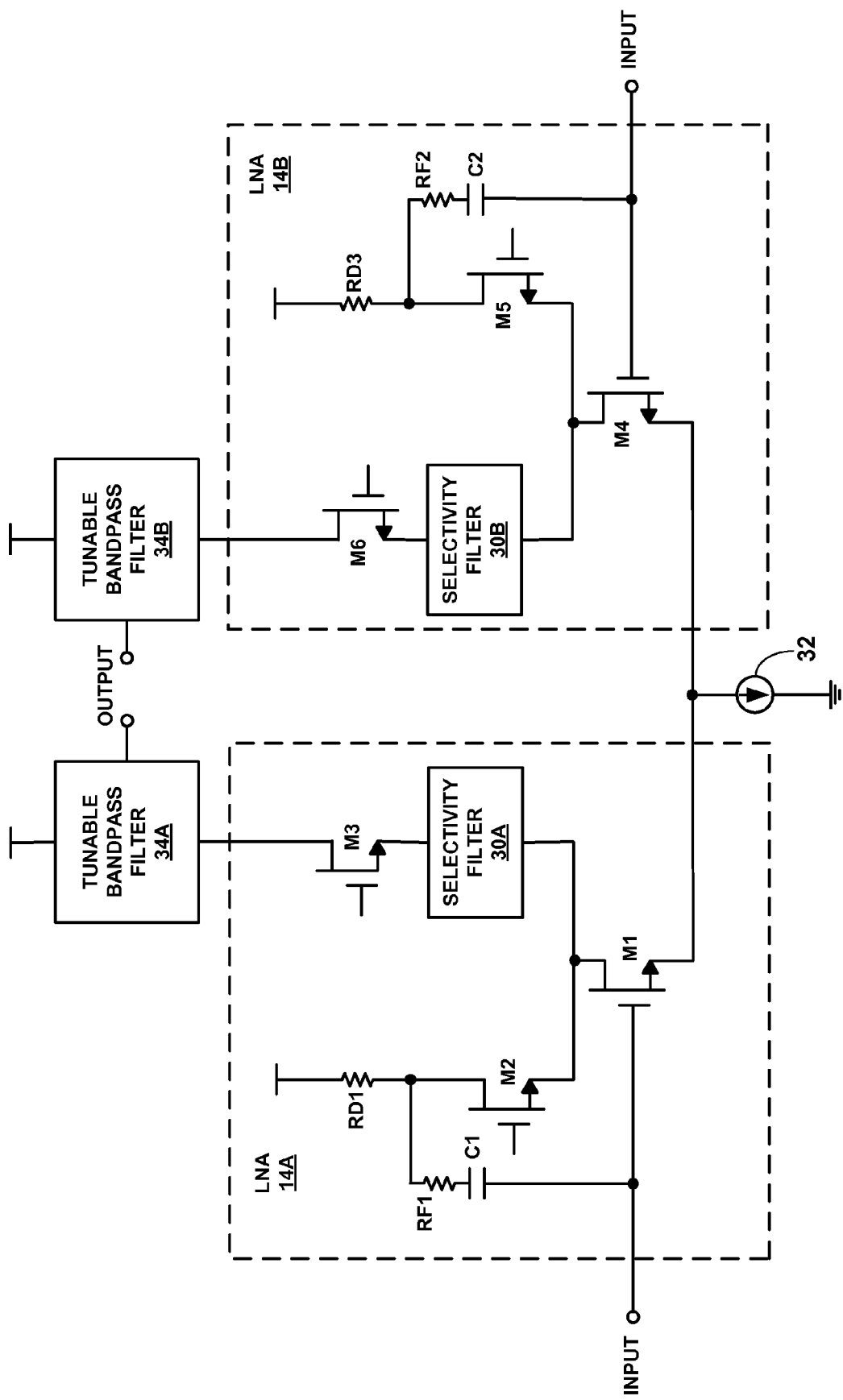
FIG. 10 is a circuit diagram illustrating a differential LNA including closed loop circuits and open loop circuits including selectivity filters and driving tunable bandpass filters.

FIG. 10 is a circuit diagram illustrating a differential LNA 14Y including closed loop circuits 22 and open loop circuits 24 with selectivity filters 30A, 30B and driving tunable bandpass filters 34A, 34B. In the example of FIG. 10, a first LNA 14A receives a positive differential input signal and a second LNA 14B receives a negative differential input signal. LNA 14A includes transistors M1, M2, M3, resistors RF1, RD1, and capacitor C1, arranged in the manner described above with respect to FIG. 3. LNA 14B is configured identically to LNA 14A, and includes corresponding transistors M4, M5, M6, resistors RD3 and RF1, and capacitor C2. As in the previous examples, the gates of transistors M2, M3 and M5, M6 may be coupled to respective bias circuits (not shown) that apply bias currents so that the transistors remain in the active region of operation Each LNA 14A, 14B includes a selectivity filter 30A, 30B, respectively, between transistor M1 and transistor M3 and between transistor M4 and transistor M6. In addition, each LNA 14A, 14B drives a respective tunable bandpass filter 34A, 34B, or a portion of a shared tunable bandpass filter. LNA 14A and 14B are combined to accept a differential input signal across positive and negative input terminals, drive tunable bandpass filters 34A, 34B and produce a combined differential output signal across positive and negative output terminals presented by the tunable bandpass filters. Also shown in FIG. 8 is optional current source 32 extending from the common node coupling the sources of transistors M1 and M4 to ground.

Figure 11:
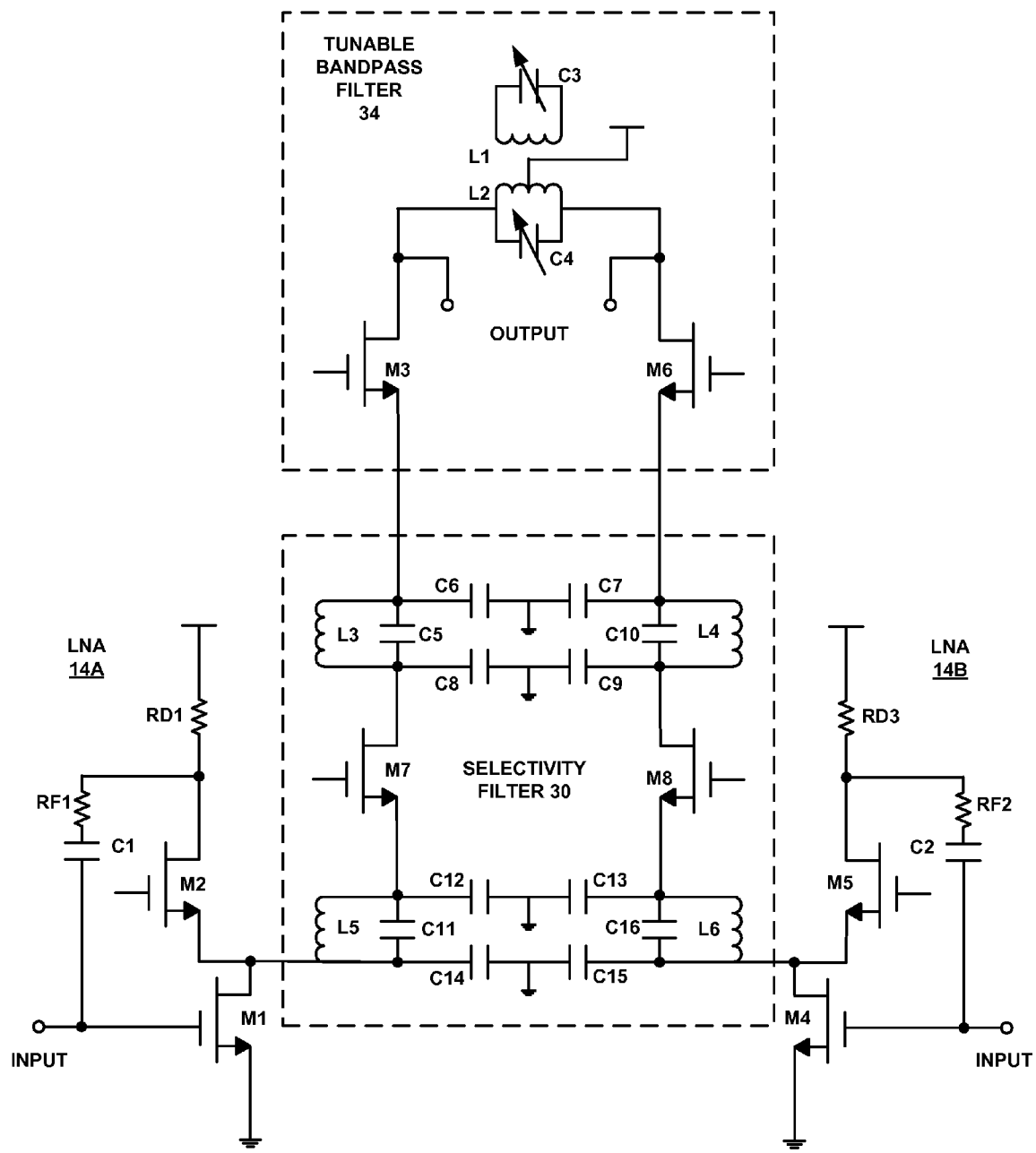
FIG. 11 is another circuit diagram illustrating a differential LNA including closed loop and open loop circuits including selectivity filters and driving tunable bandpass filters in more detail.

FIG. 11 is another circuit diagram illustrating a differential LNA 14Z comprising closed loop circuits 22 and open loop circuits 24 including selectivity filter 30 and driving a tunable bandpass filter 34 in more detail. In the example of FIG. 11, LNA 14A includes transistors M1, M2 and M3, resistors RF and RD1, and capacitor C1. LNA 14B includes transistors M4, M5 and M6, resistors RF2 and RD3, and capacitor C2. One side of selectivity filter 24 is coupled to the drain of transistor M1 and the source of transistor M2. Another side of selectivity filter 24 is coupled to the drain of transistor M4 and the source of transistor M5.

Selectivity filter 24 may comprise two transistors M7 and M8 and two LC tank circuits comprising inductor coils L3-L6 and capacitors C5-C16. Inductor L3 and C5 may be connected in parallel to each other. A first side of the parallel combination of L3 and C5 is coupled in common to ground via capacitor C6 and to the drain of transistor M3. A second side of the parallel combination of L3 and C5 is coupled in common to ground via capacitor C8 and to the source of transistor M7. Inductor L4 and capacitor C10 are similarly coupled in parallel. A first side of the parallel combination of L4 and C10 is coupled in common to ground via capacitor C7 and to the drain of transistor M6. A second side of L4 and C10 is coupled in common to ground via capacitor C9 and to the source of transistor M8. may be connected to a capacitor C7 to a second side of a voltage source in series. A second side of the parallel combination may be connected to a capacitor C9 to a second side of a voltage source in series.

Inductor L5 and capacitor C11 are coupled in parallel to one another. A first side of the parallel combination of L5 and C11 may be coupled in common to ground via capacitor C12 and to the drain of transistor M7. A second side of the parallel combination of L5 and C11 is coupled in common to ground via capacitor C14 and to the source of transistor M1 and drain of transistor M2. Inductor L6 and capacitor C16 may be connected in parallel to one other. A first side of the parallel combination of L6 and C16 is coupled in common to ground via capacitor C13 and to the drain of transistor M8. A second side of the parallel combination of L6 and C16 is coupled in common to ground via capacitor C15 and to the source of transistor M4 and the drain of transistor M5.

Tunable band-pass filter 34 may comprise two inductors, L1 and L2, two variable capacitors, C3 and C4, and two transistors, M3 and M6. Variable capacitors C3, C4 may be formed by switched capacitor networks that can be selectively switched to tune the tunable bandpass filter 34 to desired bands. Inductor L1 and variable capacitor C3 are connected in parallel. Similarly, inductor L2 and variable capacitor C4 are connected in parallel. The parallel combination of L1 and C3 may be electromagnetically coupled to the parallel combination of L2 and C4. A center tap of inductor L2 may be connected to a voltage source. A first side of the parallel combination of L2 and C4 may be connected to the drain of transistor M3. A second side of the parallel combination of L2 and C4 may be connected to the drain of transistor M6. The source of transistor M3 may be connected to the first side of the parallel combination of inductor L3 and capacitor C5 of selectivity filter 30. The source of transistor M6 may be connected to the first side of the parallel combination of inductor L4 and capacitor C10 of selectivity filter 30.

Selectivity filter 30 forms, in effect, a double cascode and elliptic rejection filter. In general, in-band signals at the drain nodes of transistors M7 and M8 experience low impedance while jammer signals outside of the band of interest experience high impedance. Also, in-band signals flowing from the drains of transistors M7 and M8 across capacitors C12 and C13 experience high impedance, while jammer signals experience low impedance and are shunted to ground. Thus, in selectivity filter 30, signals in the band of interest are amplified while jammer signals are rejected. For a high degree of rejection, a high Q for the filter may be important. In addition, low k (coefficient of coupling) between inductors L5 and L6 and between inductors L3 and L4, as well as substantial symmetry between inductors L5, L6 and inductors L3, L4, may be important.

Example circuit component values for the example implementation of FIG. 11 may be provided as follows:

Transistor M1: 975 microns/0.18 microns (gate width/gate length)
Transistor M2: 132 microns/0.18 microns
Transistor M7: 810 microns/0.18 microns
Resistor RF1: 2.7 kohms
Resistor RD1: 1 kohm
Capacitor C1: 2.5 pF
Inductor L5: 3 nH
Capacitor C1: 3 pF
Capacitor C14: 3 pF
Capacitor C12: 8 pF
Inductor L3: 9 nH
Capacitor C5: 1 pF
Capacitor C8: 2 pF
Capacitor C6: 2 pF
Transistor M3: 360 microns/0.2 microns
Inductor L1: 11 nH
Inductor L2: 11 nH
Capacitor C3: tunable from 230 fF to 3.5 pF Identical component values may be provided for components on the other half of the circuit, which is essentially a mirror image of the half of the circuit above. The above circuit component values are provided for purposes of example and illustration, and should not be consider limiting of the various examples described in this disclosure.

Various examples have been disclosed. Various transistors, resistors, capacitors and inductors and other components described in this disclosure may be realized by any of a variety of suitable technologies and fabrication techniques. For example, such components may be formed within one or more integrated circuit devices, formed by combinations of integrated circuit components and discrete components, or formed entirely by discrete components. Transistors may be FETs or other types of transistors. Appropriate component values, physical properties and characteristics may be selected according to design requirements, including desired frequency response, gain, and selectivity of the LNA. In addition, for purposes of integration circuit fabrication, any of a variety of lithographic techniques and technologies may be used. These and other examples are within the scope of the following claims.

The invention claimed is:

1. An amplifier comprising:
   a closed loop circuit that provides impedance matching for an input signal, wherein the closed loop circuit includes an input transistor and a feedback transistor; and
   an open loop circuit, coupled to the closed loop circuit, that amplifies the impedance-matched input signal, wherein the open loop circuit includes the input transistor and an output transistor.

2. The amplifier of claim 1, wherein a gate of the input transistor receives the input signal, a drain of the feedback transistor is coupled to a source of the input transistor, a drain of the output transistor is coupled to the source of the input transistor, and a source of the feedback transistor is coupled to the gate of the input transistor via a feedback loop.

3. The amplifier of claim 1, further comprising a selectivity filter within the open loop circuit that rejects frequencies outside of a selected band.

4. The amplifier of claim 3, wherein the selectivity filter comprises a notch filter.

5. The amplifier of claim 3, further comprising a bandpass filter coupled to an output of the open loop circuit.

6. The amplifier of claim 3, wherein the bandpass filter is tunable.

7. The amplifier of claim 1, further comprising a bandpass filter coupled to an output of the open loop circuit.

8. The amplifier of claim 1, wherein the bandpass filter is tunable.

9. An amplifier comprising:
   a closed loop circuit that provides impedance matching for an input signal; and
   an open loop circuit, coupled to the closed loop circuit, that amplifies the impedance-matched input signal, wherein the amplifier is a differential amplifier, the closed loop circuit includes a first closed loop circuit that provides impedance matching for a positive component of the input signal, and a second closed loop circuit that provides impedance matching for a negative component of the input signal, and the open loop circuit includes a first open loop circuit that amplifies the positive component of the input signal and a second open loop circuit that amplifies the negative component of the input signal.

10. The amplifier of claim 1, wherein the closed loop circuit provides impedance matching for the input signal over a frequency range of approximately 470 megahertz to approximately 862 megahertz.

11. A wireless receiver comprising:
    a radio frequency (RF) antenna; and
    an amplifier comprising:
      a closed loop circuit that provides impedance matching for an input signal received via the antenna, wherein the closed loop circuit includes an input transistor and a feedback transistor, and
      an open loop circuit, coupled to the closed loop circuit, that amplifies the impedance-matched input signal, wherein the open loop circuit includes the input transistor and an output transistor.

12. The receiver of claim 11, wherein a gate of the input transistor receives the input signal, a drain of the feedback transistor is coupled to a source of the input transistor, a drain of the output transistor is coupled to the source of the input transistor, and a source of the feedback transistor is coupled to the gate of the input transistor via a feedback loop.

13. The receiver of claim 11, further comprising a selectivity filter within the open loop circuit that rejects frequencies outside of a selected band.

14. The receiver of claim 13, wherein the selectivity filter comprises a notch filter.

15. The receiver of claim 13, further comprising a bandpass filter coupled to an output of the open loop circuit.

16. The receiver of claim 13, wherein the bandpass filter is tunable.

17. The receiver of claim 11, further comprising a bandpass filter coupled to an output of the open loop circuit.

18. The receiver of claim 11, wherein the bandpass filter is tunable.

19. The receiver of claim 11, wherein the closed loop circuit provides impedance matching for the input signal over a frequency range of approximately 470 megahertz to approximately 862 megahertz.

20. The receiver of claim 11, further comprising a down-mixer, coupled to an output of the amplifier, that down converts a frequency of the amplified input signal to a baseband frequency, an analog-to-digital converter that converts the based frequency input signal to a digital value.

21. A wireless receiver comprising:
a radio frequency (RF) antenna; and
an amplifier comprising:
- a closed loop circuit that provides impedance matching for an input signal received via the antenna, and
- an open loop circuit, coupled to the closed loop circuit, that amplifies the impedance-matched input signal, wherein the amplifier is a differential amplifier, the closed loop circuit includes a first closed loop circuit that provides impedance matching for a positive component of the input signal, and a second closed loop circuit that provides impedance matching for a negative component of the input signal, and the open loop circuit includes a first open loop circuit that amplifies the positive component of the input signal and a second open loop circuit that amplifies the negative component of the input signal.

22. A method comprising:
- providing impedance matching for an input signal via a closed loop circuit, wherein the closed loop circuit includes an input transistor and a feedback transistor; and
- amplifying the impedance-matched input signal via an open loop circuit, wherein the open loop circuit includes the input transistor and an output transistor, and wherein the open loop circuit and the closed loop circuit share a common input transistor to receive the input signal.

23. The method of claim 22, wherein a gate of the input transistor receives the input signal, a drain of the feedback transistor is coupled to a source of the input transistor, a drain of the output transistor is coupled to the source of the input transistor, and a source of the feedback transistor is coupled to the gate of the input transistor via a feedback loop.

24. The method of claim 22, further comprising rejecting frequencies in the amplified input signal outside of a selected band via a selectivity filter within the open loop circuit.

25. The method of claim 24, wherein the selectivity filter comprises a notch filter.

26. The method of claim 24, further comprising bandpass filtering the amplified signal via a bandpass filter coupled to an output of the open loop circuit.

27. The method of claim 22, further comprising bandpass filtering the amplified signal via a bandpass filter coupled to an output of the open loop circuit.

28. The method of claim 22, wherein the closed loop circuit provides impedance matching for the input signal over a frequency range of approximately 470 megahertz to approximately 862 megahertz.

29. A method comprising:
- providing impedance matching for an input signal via a closed loop circuit; and
- amplifying the impedance-matched input signal via an open loop circuit, wherein the open loop circuit and the closed loop circuit share a common input transistor to receive the input signal, wherein the amplifier is a differential amplifier, the closed loop circuit includes a first closed loop circuit that provides impedance matching for a positive component of the input signal, and a second closed loop circuit that provides impedance matching for a negative component of the input signal, and the open loop circuit includes a first open loop circuit that amplifies the positive component of the input signal and a second open loop circuit that amplifies the negative component of the input signal.

30. An amplifier comprising:
- means for providing impedance matching for an input signal, wherein the means for providing impedance matching includes an input transistor and a feedback transistor; and
- means for amplifying the impedance-matched input signal coupled to the means for providing impedance matching, wherein the means for amplifying the impedance-matched input signal includes the input transistor and an output transistor.

* * * * *